(12) United States Patent
Egner et al.

(10) Patent No.: US 10,745,143 B2
(45) Date of Patent: Aug. 18, 2020

(54) AIRCRAFT FUEL PUMP

(71) Applicant: Eaton Limited, Titchfield Hampshire (GB)

(72) Inventors: John Egner, Southampton (GB); Nigel Bradshaw, Southampton (GB)

(73) Assignee: EATON INTELLIGENT POWER LIMITED, Dublin (IE)

( * ) Notice: Subject to any disclaimer, the term of this patent is extended or adjusted under 35 U.S.C. 154(b) by 302 days.

(21) Appl. No.: 15/567,971

(22) PCT Filed: Apr. 22, 2016

(86) PCT No.: PCT/EP2016/059000
§ 371 (c)(1),
(2) Date: Oct. 20, 2017

(87) PCT Pub. No.: WO2016/170108
PCT Pub. Date: Oct. 27, 2016

(65) Prior Publication Data
US 2018/0118365 A1 May 3, 2018

(30) Foreign Application Priority Data
Apr. 22, 2015 (GB) .................................... 1506838.0

(51) Int. Cl.
*B64D 37/04* (2006.01)
*F02C 7/22* (2006.01)
(Continued)

(52) U.S. Cl.
CPC ........... *B64D 37/005* (2013.01); *B64D 37/04* (2013.01); *F02C 7/22* (2013.01); *F02C 7/32* (2013.01); *H05K 7/20863* (2013.01)

(58) Field of Classification Search
CPC ...... B64D 37/04; B64D 37/005; B64D 37/14; B64C 17/10
See application file for complete search history.

(56) References Cited

U.S. PATENT DOCUMENTS 3,550,678 A * 12/1970 Pfouts .................... B64D 33/10
165/44
4,696,442 A * 9/1987 Mazzitelli ............... B64C 23/06
244/200.1
(Continued)

FOREIGN PATENT DOCUMENTS

CN 101437721 A 5/2009
CN 104349977 A 2/2015
(Continued)

OTHER PUBLICATIONS

Wikipedia, "Vortex tube", https://en.wikipedia.org/wiki/Vortex_tube; archived by Internet Archive on Sep. 18, 2014; https://web.archive.org/web/20140918204328/https://en.wikipedia.org/wiki/Vortex_tube; accessed Oct. 1, 2019 (Year: 2014).*

*Primary Examiner* — Philip J Bonzell
*Assistant Examiner* — Tye William Abell
(74) *Attorney, Agent, or Firm* — Leydig, Voit & Mayer, Ltd.

(57) ABSTRACT

In an embodiment, the present invention provides an aircraft fuel pump assembly including: a pump; a canister to enclose the pump and mount the pump within an aircraft fuel tank; and a discrete electronics unit mounted remotely to the pump. In another embodiment, the present invention provides a manhole cover for an aircraft, comprising an integral mounting for an electronics unit.

13 Claims, 3 Drawing Sheets

(51) Int. Cl.
 *F02C 7/32* (2006.01)
 *B64D 37/00* (2006.01)
 *H05K 7/20* (2006.01)

(56) References Cited

U.S. PATENT DOCUMENTS

| | | | |
|---|---|---|---|
| 6,675,778 | B1 | 1/2004 | Kemper et al. |
| 9,296,467 | B1* | 3/2016 | Hollibaugh ............... B64C 3/34 |
| 9,556,838 | B2 | 1/2017 | Wood |
| 2008/0308076 | A1* | 12/2008 | Reynolds ................ F04B 17/03 |
| | | | 123/519 |
| 2015/0114477 | A1* | 4/2015 | Wood ....................... F02C 9/28 |
| | | | 137/12 |
| 2015/0321767 | A1 | 11/2015 | Kamath et al. |
| 2016/0159466 | A1* | 6/2016 | Daggett ................ B64C 23/005 |
| | | | 244/87 |

FOREIGN PATENT DOCUMENTS

| | | |
|---|---|---|
| GB | 851428 A | 10/1960 |
| GB | 2501289 A | 10/2013 |
| WO | WO 2007071908 A1 | 6/2007 |
| WO | WO 2007128953 A1 | 11/2007 |
| WO | 102007051498 A1 | 4/2009 |

* cited by examiner

AIRCRAFT FUEL PUMP

CROSS-REFERENCE TO PRIOR APPLICATIONS

This application is a U.S. National Phase application under 35 U.S.C. § 371 of International Application No. PCT/EP2016/059000, filed on Apr. 22, 2016, and claims benefit to Great Britain Patent Application No. 1506838.0, filed on Apr. 22, 2015. The International Application was published in English on Oct. 27, 2016 as WO 2016/170108 under PCT Article 21(2).

FIELD

This invention relates to an aircraft fuel pump assembly. The invention may also relate to an aircraft and to an aircraft fuel system.

BACKGROUND

Fuel pumps are an essential part of aircraft fuel systems and may typically provided within the aircraft fuel tanks. For example, one or more pump may be used as a "boost pump" to provide or maintain a flow of fuel under pressure to an engine and/or one or more fuel pump may be used as a "transfer pump" to transfer fuel between separate fuel tanks (for example for balance purposes). It is known to provide a fuel pump mounted within a "canister" configured to be mounted within the fuel tank in use. The canister conveniently provides ease of installation and allows the pump to be removed (for maintenance or inspection) or replaced without the need to drain the fuel tank.

Electronics associated with a fuel pump, including for example the power supply (typically including an inverter) and control circuitry, are conventionally integral with the fuel pump and mounted within the canister. It will be appreciated that modern fuel pumps may have increasingly complex electronics. Further, modern aircraft may increasing adopt a "Variable-frequency" power generation system and, therefore, individual electrically powered aircraft components, such as fuel pump assemblies, may be expected to require more complex associated electronics. It is important that aircraft fuel pumps have relatively high reliability and it will be appreciated that increasing complexity of electronics may adversely impact the meantime between failure (MTBF) of such fuel pumps.

SUMMARY

In an embodiment, the present invention provides an aircraft fuel pump assembly comprising: a pump; a canister configured to enclose the pump and mount the pump within an aircraft fuel tank; and a discrete electronics unit configured to be mounted remotely to the pump.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
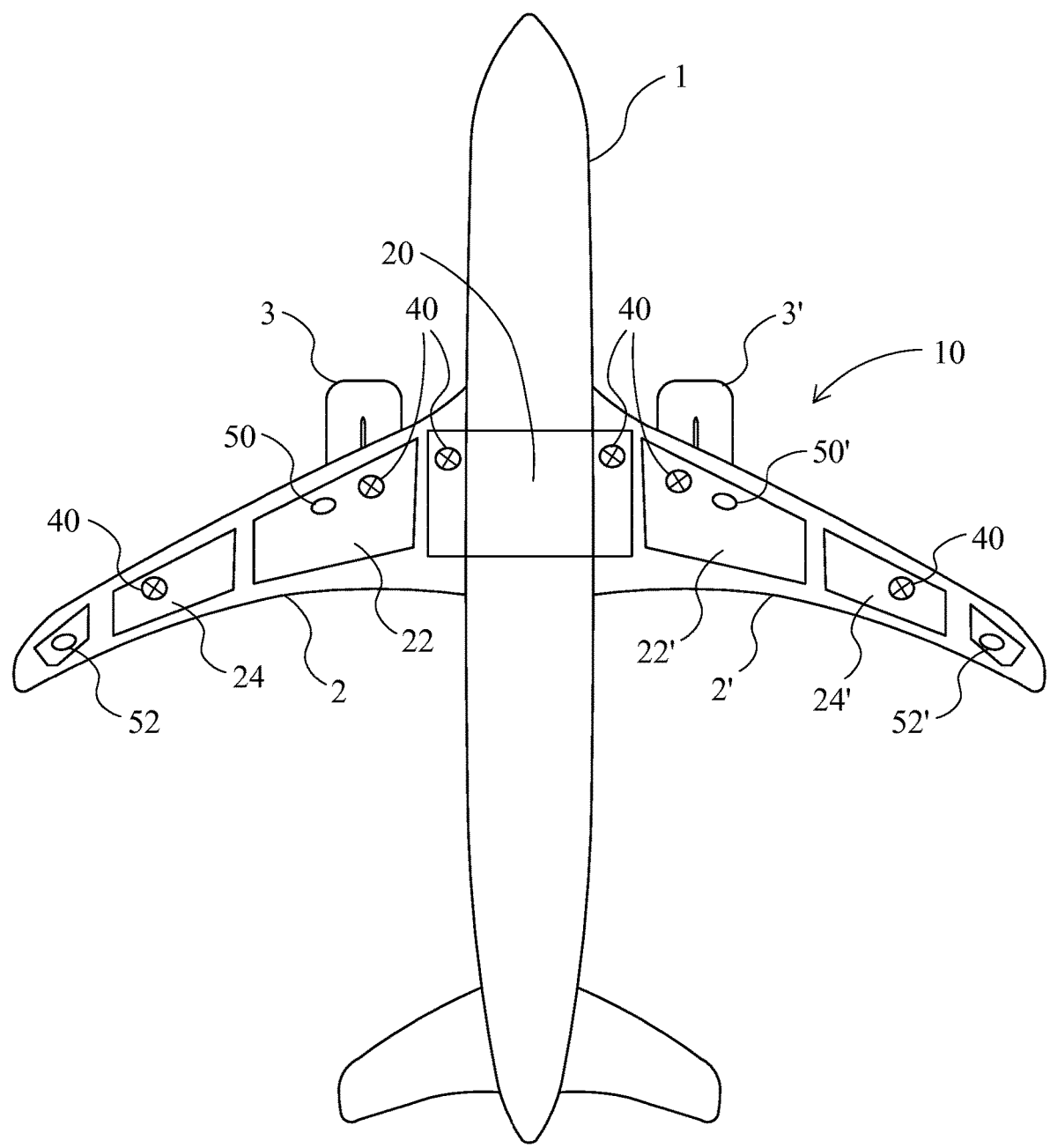
FIG. 1 is a schematic representation of an aircraft having a fuel system including at least one fuel pump in accordance with an embodiment of the invention.

Accordingly, in one aspect, this invention provides an aircraft fuel pump assembly comprising; a pump; a canister, arranged to enclose the pump and mount the pump within an aircraft fuel tank; and a discrete electronics unit configured to be mounted remotely to the pump.

As the electronics are provided in a separate and distinct unit, the canister in embodiments of the invention need only be sized to accommodate the pump. Further, issues of cooling of the electronics within the canister are avoided.

The electronics unit may include the necessary control, power electronic and electrical circuits required to drive the pump. The electronics unit may be configured to drive the pump from a variety of electrical input sources. For example the electrical input sources may include: variable frequency and voltage alternating current or direct current at either a high, low or varying voltage. The electronics unit may comprise an inverter. The electronics unit may include control circuitry. More specifically, the electronics unit may for example include at least one of: a Transformer Rectifying Unit (TRU), a smoothing filter or a motor controller.

Advantageously, by arranging the electronics separately from the pump the lay out (or "form factor") of the electronics may be optimised (rather than being constrained by the available space within the canister). For example, the electronics may be optimised to provide improved cooling or to improve access to individual components (for example for repair or replacement). It will be appreciated that the layout of electronics may directly affect the reliability (increasing or decreasing the MTBF).

According to a further aspect of the invention there is provided an aircraft fuel system comprising at least one fuel tank and at least one fuel pump assembly in accordance with an embodiment. Thus, in an embodiment the fuel system may comprise at least one fuel pump having an associated electronics unit, wherein the pump and electronics unit are provided at spaced apart locations within the aircraft fuel system.

The fuel tank may include an opening and the electronics unit may be mounted to a cover of the opening. Conveniently, the electronics unit may be mounted to the cover of an existing structural opening or access panel. For example, the fuel tank may include a manhole (which may be of a substantially conventional structural form) and the electronics unit may be mounted to a manhole cover. Alternatively the fuel system may be provided on an aircraft including an opening (such as a manhole) which is located outside of the fuel tank and the electronics unit maybe mounted on the cover of the opening.

The fuel tank will generally be defined by a fuel tank boundary. The electronics unit may be mounted outside of the boundary. Connecting wiring between the electronics unit and pump may be routed around the boundary of the fuel tank.

The fuel pump assembly may further comprise a cooling apparatus for cooling the electronics unit. For example, the electronics unit may be liquid cooled and a remote feed may be provided from a local pump to provide the cooling.

Alternatively, a local cooling arrangement may be provided (such that in some embodiments the electronics unit may be maintained or repaired without requiring the pump to be drained). The cooling apparatus may comprise an air inlet. For example an external surface proximal to the cooling apparatus may be provided with an inlet (for example a NACA duct) for providing ambient external air for cooling the electronics unit. The inlet may, for example, be formed on an outer surface of the cover (such as a manhole cover) with the electronics unit mounted internally to the cover.

Alternatively, or additionally, the cooling apparatus may comprise a heat exchanger arranged to transfer heat between the electronics unit and the air external to the aircraft (for example the airstream during use). The heat exchanger may extend through the outer surface of the aircraft (for example through the cover on which the electronics unit is mounted). The heat exchanger may comprise at least one cooling fin. The cooling fin may be arranged to project outwardly from an outer surface of the aircraft. Thus, during flight the cooling fin may be in the airstream.

According to a further aspect of the invention, there is provided a manhole cover for an aircraft, the manhole comprising an integral mounting for an electronics unit. The manhole cover may further comprise a cooling apparatus for cooling the electronics unit in use.

The invention also extends to an aircraft incorporating a fuel pump assembly or fuel system in accordance with an embodiment.

Whilst the invention has been described above, it extends to any inventive combination of the features set out above, or in the following description or drawings.

An aircraft 1 is shown in FIG. 1 which it will be appreciated may represent a typical twin engine civil airliner (although the invention is not limited to any specific type of aircraft). The aircraft 1 includes a fuel system 10 for supplying fuel to the engines 3, 3' which includes a plurality of fuel tanks 20, 22, 22', 24, 24'. As is well known in the art the fuel tanks are integrally formed within the structure of the aircraft (for example being defined in bays between spaced apart ribs and enclosed by front and rear spars and upper and lower skin panels). As such, it will be appreciated that each fuel tanks is defined by a fuel tank boundary defined by/within the structure of the aircraft. In the illustrated example the fuel system includes a centre fuel tank 20 and each wing 2, 2' includes an inboard fuel tank 22, 22' and an outboard fuel tank 24, 24'.

At least one pump 40 is provided in each fuel tank 20, 22, 22', 24, 24'. The aircraft wings 2, 2' are also provided with a number of manholes 50, 52 which allow access to the interior of the wing (for example for maintenance). Manholes may be provided either in a fuel tank, such as manholes 50, 50' in the inboard fuel tanks 22, 22' and/or outside of the fuel tank, such as manholes 52, 52' in dry bays outside of the fuel tank boundaries.

FIG. 2 shows a fuel pump assembly 30 in accordance with an embodiment of the invention. The pump assembly includes a pump 40 which is provided within a canister 42 which supports and encloses the pump within a fuel tank 20, 22, 24. The canister may be of any convenient construction suitable for mounting and supporting the pump 40 within the fuel tank 20, 22, 24 and such arrangements will be known to those skilled in the art (as such the canister is not described in detail herein).

In accordance with embodiments of the invention, the electronics unit 60 of the pump assembly 30 is provided as a separate and discrete arrangement from the pump 40. This is in direct contrast to conventional arrangements in which the pump 40 and electronics are formed integrally. The electronics unit 60 is configured to be positioned remotely from the pump 40 (such that it need not be accommodated within the canister 42). Cabling 68 is provided between the electronics unit 60 and the pump 40 (and may include both power and control/monitoring connections).

The electronics unit 60 may typically include an inverter, a TRU, a smoothing filter and/or a motor controller. As the electronics unit 60 is not within the canister 42, the layout need not be constrained and the form factor can be optimised to maximise reliability (increasing MTBF) and/or to reduce complexity to reduce manufacturing cost.

Conveniently, the electronics unit 60 may be mounted on a manhole 50, 52. The electronics unit 60 could be mounted such that it is either removable separately from the manhole 50, 52 (i.e. the manhole is removed first and the electronic unit remains mounted within the aircraft) or such that it is removed with the manhole 50, 52 when the manhole is opened. Equally, in some embodiments the electronics unit 60 may be removable with the manhole 50 remaining in situ. A suitable sealing arrangement would generally be provided such that the electronics unit 60 is within a suitably sealed environment with the manhole cover 50, 52.

Figure 2A:
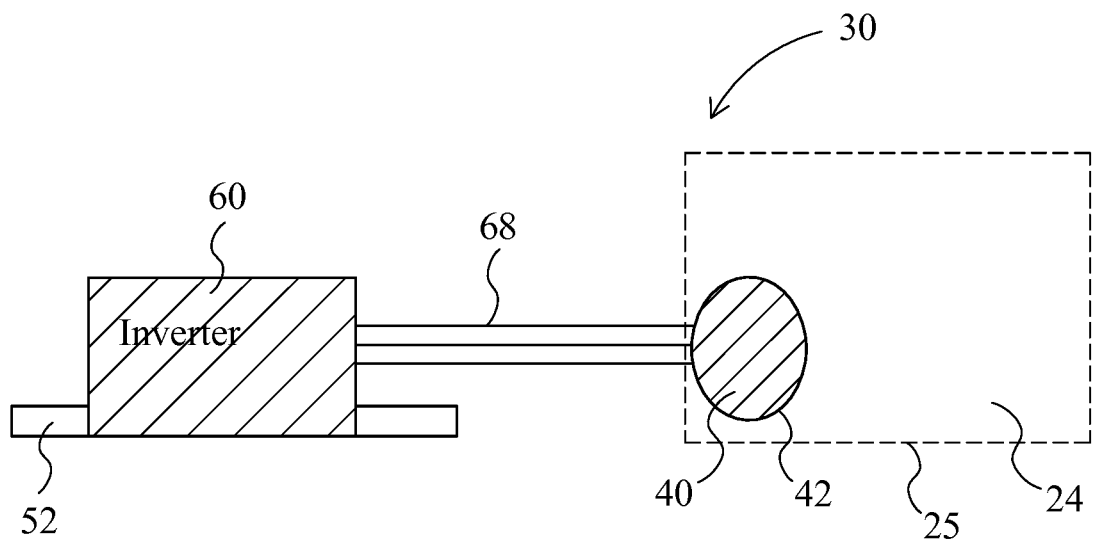
FIG. 2A is a schematic showing the arrangement of a fuel pump assembly according to a first embodiment of the invention.
Figure 2B:
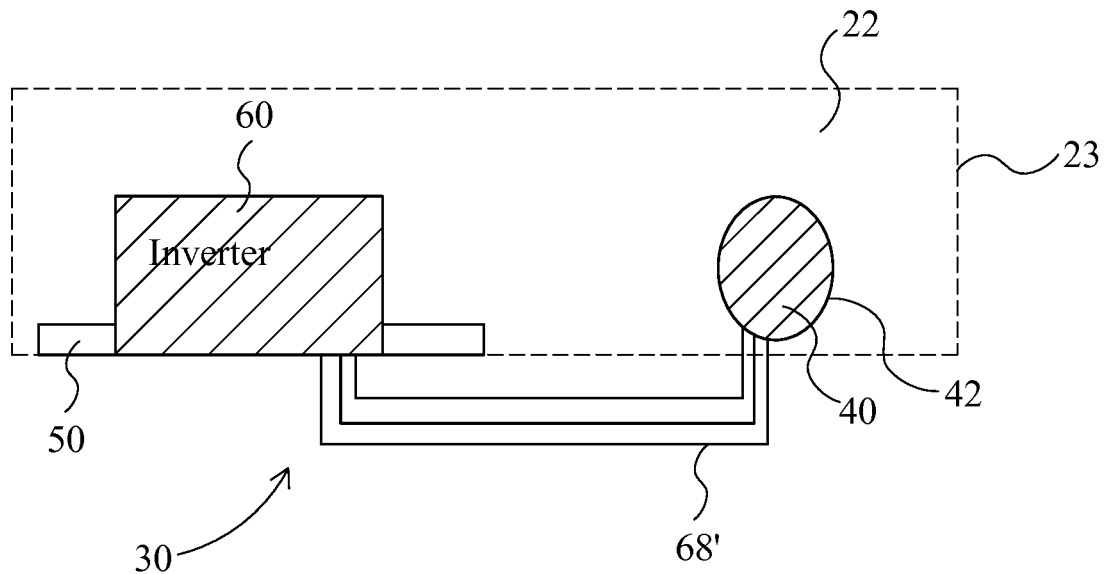
FIG. 2B is a schematic showing the arrangement of a fuel pump assembly according to a second embodiment of the invention.

It will be noted that in some embodiments, as shown in FIG. 2A, the electronics unit 60 may be located outside of the boundary 25 of the fuel tank 24 (i.e. in a dry bay adjacent to the fuel tank 24). In such an arrangement the connection 68 between the electronics unit 60 and pump 40 is routed through the boundary of the fuel tank 25 (for example extending through a rib of the aircraft structure). Alternatively, as shown in FIG. 2B, the electronics unit 60 may be arranged within a fuel tank 22. In such an arrangement the connection 68' between the electronics unit 60 and pump may be routed by a suitable means (and may pass outside of the fuel tank boundary 23 adjacent to the electronics unit and re-enter adjacent to the pump 40). The particular arrangement selected may depend upon the type and purpose of the aircraft. For example, in a civil aircraft applications the pump 40 may typically be mounted in the canister 42 and the electrical connection would be external to the tank. In contrast, a military aircraft application may utilise an embedded pump.

Figure 3A:
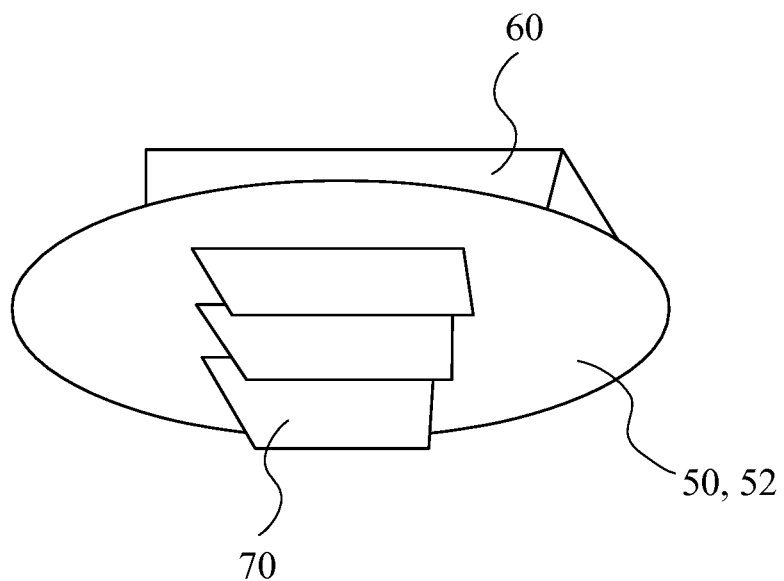
FIG. 3A is a schematic showing a passive cooling arrangement on a manhole.
Figure 3B:
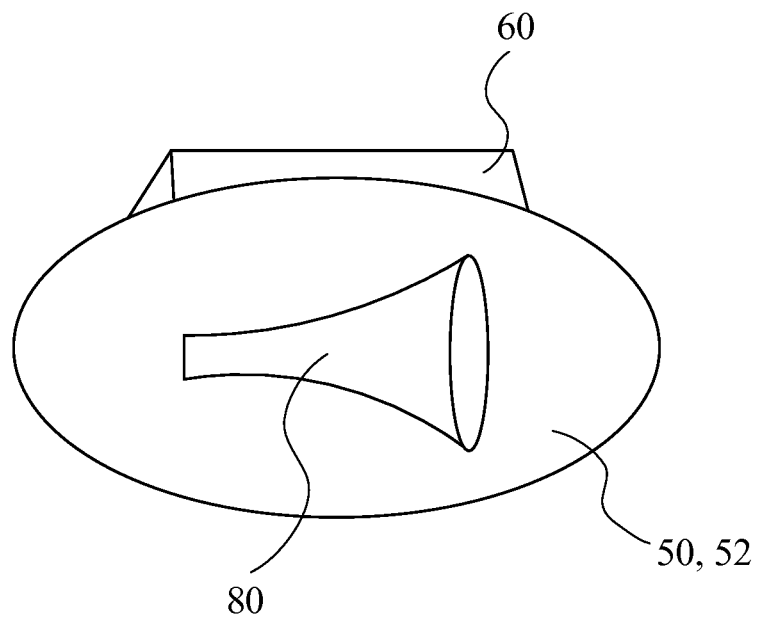
FIG. 3B is a schematic showing a NACA scoop inlet on a manhole.

The electronics unit 60 may be liquid cooled and a remote feed may be provided from a local pump to provide the cooling. Alternatively (or additionally), as shown in FIG. 3A a passive cooling arrangement may be provided by providing fins 70 extending to an exterior surface of the cover of the manhole 50, 52 with which the electronics unit 60 is associated. The fins 70 extend into the ambient external airstream during flight and would provide a heat exchange arrangement for dissipating heat generated in the electronics unit 60 during use. Alternatively (or additionally) a NACA scoop inlet 80 could be provided on the exterior of the manhole 50, 52 (or even an external surface of the aircraft proximal to the manhole) to provide air cooling of the electronics unit 60. It will be appreciated that the cooling arrangement may be selected depending upon factors such as the level of cooling required and the acceptable drag level for the aircraft.

It will be appreciated that embodiments of the invention may, advantageously, allow the electronics unit to be more easily and simply accessed for maintenance and repair. In particular, in embodiments utilising air cooling or passive cooling the electronics unit may be arranged to be replaceable without the need to carry out any pump drain operations. This may be particularly advantageous as the fuel pump (which would remain mounted in a conventional canister) can be expected to be more reliable that the electronics unit. Further since the electronics unit form factor would not be compromised due to constraints of the fuel pump and canister, it would be expected that the MTBF of the electronics unit in embodiments could be improved over conventional arrangements.

The skilled person will appreciate that in embodiments of the invention the pump assembly is separated into two distinct Line Replaceable Units (LRUs) (i.e. the pump and the electronics unit). This is in direct contrast to conventional arrangements in which the pump and associated pump electronics form a single LRU. The aircraft may be provided with suitable diagnostics which are configured to provide determination as to heather a fault is occurring in the pump or electronics unit and as such during maintenance or repair it may be possible to only repair or replace a single LRU. In particular, the electronics unit may be provided with built in diagnostics to help identify/distinguish between electronics and pump faults.

Although the invention has been described above with reference to preferred embodiments, it will be appreciated that various changes or modifications may be made without departing from the scope of the invention as defined in the appended claims.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An aircraft fuel pump assembly comprising:
   a pump;
   a canister configured to enclose the pump and mount the pump within an aircraft fuel tank; and
   a discrete electronics unit configured to be mounted remotely to the pump, outside the canister,
   wherein the fuel tank includes an opening and the electronics unit is mounted to a cover of the opening.

2. The pump assembly as claimed in claim 1, wherein the electronics unit comprises control electronics, power electronics, and electrical circuits configured to drive the pump from a power source.

3. The pump assembly as claimed in claim 1, wherein the electronics unit is air cooled.

4. An aircraft fuel system comprising at least one fuel tank and at least one fuel pump assembly as claimed in claim 1.

5. The aircraft fuel system as claimed in claim 4, wherein the opening comprises a manhole.

6. The aircraft fuel system as claimed in claim 4, wherein the fuel tank defines a fuel tank boundary and the electronics unit is mounted outside of the fuel tank boundary.

7. The aircraft fuel system as claimed in claim 4, further comprising a cooling apparatus configured to cool the electronics unit.

8. The aircraft fuel system as claimed in claim 7, wherein the cooling apparatus comprises an air inlet.

9. The aircraft fuel system as claimed in claim 7, wherein the cooling apparatus comprises at least one cooling fin arranged to project outwardly from an outer surface of the aircraft into an airstream during use.

10. An aircraft comprising a fuel pump assembly as claimed in claim 1.

11. An aircraft comprising a fuel system as claimed in claim 4.

12. A manhole cover for an aircraft having a fuel tank and a fuel pump assembly, the fuel pump assembly comprising a pump enclosed in a canister disposed in the fuel tank, the manhole cover comprising:
   an electronics unit configured to control the pump such that the electronics unit is disposed outside the canister.

13. The manhole cover as claimed in claim 12, further comprising a cooling apparatus configured to cool the electronics unit in use.

* * * * *